United States Patent

Ishimaru et al.

[11] Patent Number: 5,998,849

[45] Date of Patent: *Dec. 7, 1999

[54] SEMICONDUCTOR DEVICE HAVING HIGHLY-DOPED SOURCE/DRAIN REGIONS WITH INTERIOR EDGES IN A DISLOCATION-FREE STATE

[75] Inventors: Kazunari Ishimaru, Yokohama; Fumitomo Matsuoka, Kawasaki; Kaori Umezawa, Yokohama, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/990,972

[22] Filed: Dec. 15, 1997

[30] Foreign Application Priority Data

Dec. 17, 1996 [JP] Japan ................................... 8-336939

[51] Int. Cl.⁶ ................................................. H01L 29/78
[52] U.S. Cl. ........................ 257/410; 257/336; 257/344; 257/900
[58] Field of Search .................................... 257/410, 900, 257/336, 344, 411

[56] References Cited

U.S. PATENT DOCUMENTS

| 4,994,404 | 2/1991 | Sheng et al. ........................... 257/344 |
| 5,274,261 | 12/1993 | Chen ....................................... 257/344 |
| 5,386,133 | 1/1995 | Hiroki et al. ........................... 257/344 |
| 5,436,482 | 7/1995 | Ogoh ...................................... 257/344 |
| 5,534,723 | 7/1996 | Iwai et al. .............................. 257/360 |
| 5,663,586 | 9/1997 | Lin .......................................... 257/336 |
| 5,698,883 | 12/1997 | Mizuno ................................... 257/344 |
| 5,719,425 | 2/1998 | Akram et al. .......................... 257/344 |
| 5,747,852 | 5/1998 | Chang et al. .......................... 257/336 |
| 5,844,276 | 12/1998 | Fulford, Jr. et al. .................. 257/336 |
| 5,847,428 | 12/1998 | Fulford, Jr. et al. .................. 257/344 |

*Primary Examiner*—Jerome Jackson, Jr.
*Assistant Examiner*—Bradley William Baumeister
*Attorney, Agent, or Firm*—Banner & Witcoff, Ltd.

[57] ABSTRACT

A semiconductor device comprises an LDD structure MOS transistor wherein the formation of defects due to ion implantation at the edge of the side wall of the gate electrode is suppressed. In order to perform the ion implantation for forming the source and drain regions of the MOS transistor, impurity ions are implanted using the first and second side walls provided to the gate electrode as a mask, and then the heat treatment for impurity activation is performed after removing the second side wall near the source and drain regions doped with high-concentration impurity ions. By removing the second side wall prior to the heat treatment, the stress applied to the edges of the high-concentration impurity doped regions in an amorphous state is decreased. The defects therefore can be suppressed from being formed at the edges of the source and drain regions near the gate electrode in the recrystallization of the amorphous layer by the heat treatment. As a result, the semiconductor device with high performance and reliability, in which the gate leakage current is small, and the manufacturing method thereof can be attained.

6 Claims, 3 Drawing Sheets

SEMICONDUCTOR DEVICE HAVING HIGHLY-DOPED SOURCE/DRAIN REGIONS WITH INTERIOR EDGES IN A DISLOCATION-FREE STATE

BACKGROUND OF THE INVENTION

This invention relates to a semiconductor device comprising a plurality of MOS transistors with high performance and high reliability, in which an amount of leakage current flowing through the junction between source and drain regions and a substrate is small.

In recent years, a single drain structure has been widely used in the field of a MOS transistor. In this structure, a gate electrode is used as a mask in the ion implantation process for forming the source and drain regions immediately after the forming of the gate electrode. FIG. 1 shows the sectional view of the single drain structure. In the drawing, 1 denotes a silicon substrate, 2 denotes a gate insulator film, 3 denotes a gate electrode formed from polysilicon, and 8 denotes source and drain regions formed to have high impurity concentration in the ion implantation process using the gate electrode 3 as a mask.

With such a structure, however, the punch-through phenomena may occur or hot carriers may be generated at the drain edge if the MOS transistor is miniaturized for attaining high speed operation and high integration level. When such phenomena occur, the performance of the transistor may be degraded.

In order to solve this problem, various double drain structures such as a lightly doped drain structure (hereinafter referred to as an "LDD structure") shown in FIG. 2 have been proposed. These methods are employed as a mainstream in the present time, in which source and drain regions are formed after forming a side wall surrounding the gate electrode.

According to these methods, after a gate electrode 3 is formed from polysilicon, the shallow ion implantation is performed to form LDD source and drain region 5, as indicated by a real line and a broken line in a silicon substrate 1 of FIG. 2. Next, the side wall 12 formed of an insulator film is provided on the polysilicon gate 3. By using the gate side wall 12 as a mask, the deep ion implantation is performed in the source and drain regions 8 to obtain a MOS transistor having the LDD structure.

Also in the conventional self-aligned silicide (hereinafter referred to "SALICIDE") process wherein refractory metal silicide is formed on the gate electrode 3 and the source and drain regions 8 in a self-aligned manner, the side wall 12 is formed on the gate electrode prior to the forming of the silicide, and then impurity ions are implanted in the gate electrode 3 and the source and drain regions 8 simultaneously.

Both in the LDD structure process and the SALICIDE process, the ends 8a of the source and drain regions 8 having high impurity concentration and deep junction depth, which are located below the gate electrode 3, are not located near the edge 3a of the gate electrode 3 but near the edge 12a of the side wall 12, prior to the heat treatment for impurity activation.

FIG. 2 shows the view of the transistor after the heat treatment. In the drawing, in which the edges 8a located below the gate electrode extend under the side wall 12. As a result of the heat treatment for impurity ions activation, the impurity implanted into the source and drain regions 8 laterally diffuse, and the edges 8a are shifted to the positions shown in the drawing. Immediately after the ion implantation, the edges 8a are adjacent to the edges 12a in the vertical direction to locate the gate insulating film 2 therebetween.

In the forming step of the source and drain regions 8 with high impurity concentration using the side wall 12 formed on the gate electrode 3 as a mask, the crystal structure of the silicon substrate 1 at the source and drain regions 8 is damaged by the implanted high concentration impurity ions, to form an amorphous silicon. While, the portions covered with the side wall 12 are not turned into amorphous silicon, and thus the boundaries between the amorphous silicon and the single crystal structure in the substrate 1 are formed at the portions located below the edges 12a of the side wall surrounding the gate.

After the impurity implantation, the heat treatment for the impurity activation and the recrystallization of the substrate are performed. In this time, if the thermal expansion coefficient of the material used for the side wall is so different from that of the substrate, the stress due to the difference in the thermal expansion coefficients may be applied to the substrate by the side wall, thereby the recrystallization of the substrate located below the side wall edge 12a may be prevented. As a result, defects are generated in the substrate at the junction between the source and drain regions and the substrate, i.e., at the edges 8a located below the side wall edge 12a, and a leakage current will flow through the junction. When the leakage current is extremely large, the MOS transistor may not operate.

In this time, the annealing of the defects, i.e., the perfect recrystallization of the substrate in the amorphous state can be attained by performing a heat treatment at a temperature as high as 1000° C. over one hour. Due to the heat treatment, however, the doped impurities are extensively diffused, and the desired impurity profile cannot be easily obtained. As a result, the MOS transistor does not operate with high performance.

BRIEF SUMMARY OF THE INVENTION

As described above, according to the conventional forming method of the source and drain regions of the MOS transistor, the silicon single crystal in the substrate under the side wall edge of the gate electrode is turned into an amorphous structure, in implanting the impurity ions, the amorphous structure cannot be easily recrystallized under the conventional heat treatment condition for impurity activation, which results in the current leakage at the source and drain junction.

The object of the present invention is to solve this problem by providing a semiconductor device and the manufacturing method thereof, comprising a MOS transistor capable of suppressing the generation of the defects due to the stress applied to the substrate under the gate side wall edge, and of assuring the performance equal to or better than the conventional device.

More specifically, the semiconductor device of the present invention comprises a MOS transistor wherein an edge of the side wall formed on a gate electrode, which are respectively located on one side near corresponding one of highly doped source and drain regions having high impurity concentration, is separated by a predetermined distance from an edge of one of the source and drain regions, which are located on the side near the gate electrode.

It is preferable that the predetermined distance is, obtained by removing the second side wall stacked on the first side wall when the side wall formed on the gate electrode includes the first and second side walls.

The manufacturing step of the semiconductor device of the present invention comprises the steps of: forming a side wall on a gate electrode; implanting impurity ions into source and drain regions of a MOS transistor using the gate electrode and the side wall as a mask; and performing heat treatment for activation of the impurity implanted into the source and drain regions after removing the side wall.

It is preferable to form the side wall on the gate electrode again after performing the heat treatment for impurity activation.

The gate electrode of the present invention is preferably formed of at least one of polysilicon film, refractory metal film, refractory metal silicide film, platinum silicide film, stacked film comprising polysilicon film and refractory metal film, stacked film comprising polysilicon film and refractory metal silicide film, and stacked film comprising polysilicon film and platinum silicide film.

The gate electrode is characterized in that at least one of silicon oxide film and silicon nitride film is stacked on the upper surface thereof.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The embodiment of the present invention will be described below with reference to the drawings.

Figure 1:
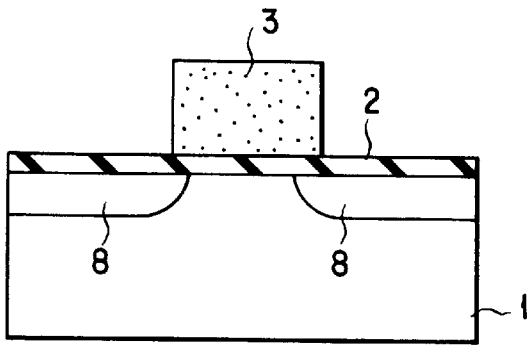
FIG. 1 is a sectional view of a MOS transistor having the conventional single drain structure.
Figure 2:
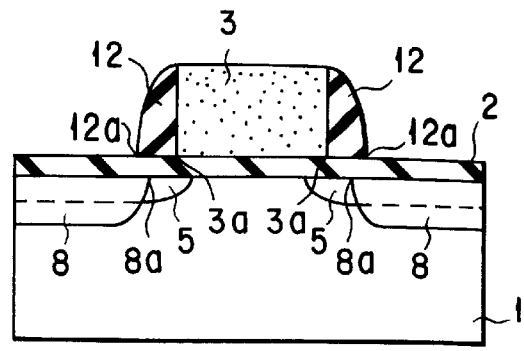
FIG. 2 is a sectional view of a MOS transistor having the conventional double drain structure.
Figure 3A:
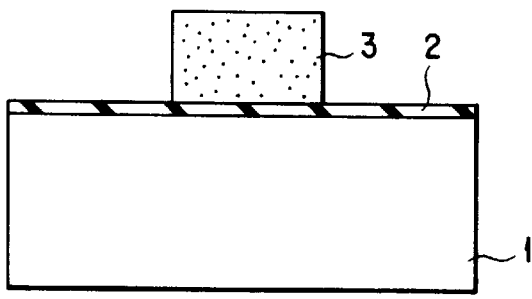
FIGS. 3A–3F are sectional views of the gate electrode according to the first embodiment of the present invention, for showing each step of the manufacturing process of a MOS transistor using the first and second side walls.

FIGS. 3A–3F are sectional views showing each step of the manufacturing process of a MOS transistor according to the first embodiment of the present invention. In FIG. 3A, 1 denotes a silicon substrate, 2 denotes a gate dioxide film, 3 denotes a gate electrode formed of polysilicon or the like and patterned by using the conventional photolithography process.

In the conventional process, a device isolation region and a well region are formed in a silicon substrate prior to the steps shown in FIG. 3A, and then impurity ions are implanted into the substrate to set the threshold voltage of the MOS transistor, a polysilicon film is deposited thereon to form a gate electrode, and then the gate electrode is patterned. Also in the process of the present invention, these steps are performed in the same manner as in the conventional process, and the description thereof will be omitted.

Figure 3B:
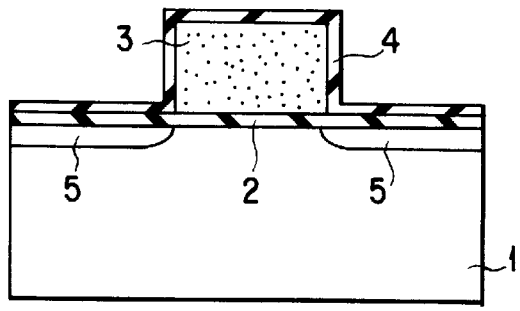

After forming the gate electrode 3 shown in FIG. 3A, a thin film 4 having a thickness of 10–50 nm is formed on the surface of the polysilicon film as the gate electrode 3 as shown in FIG. 3B, by performing a heat treatment process in an oxidizing atmosphere or a chemical vapor deposition (hereinafter referred to "CVD") process to deposit a thin film formed of silicon dioxide film or silicon nitride film, or by combining these two processes.

The thin film 4 is formed to protect the gate electrode from being etched in removing the side wall which will be formed after. The thin film 4 may be formed from any material having a sufficiently large selective etching ratio relative to the material from which the sidewall is formed. The thin film 4 is formed to be thick enough to be left even if the thin film is subjected to the removing step of the side wall after forming the side wall.

If, however, the thin film 4 is too thick, the acceleration voltage used when impurity ions are implanted into a LDD region in the silicon substrate 1 shown in FIG. 3B through the gate insulating film 2 and the thin film 4 must be set at high level. The thin film 4 thus must not be unnecessarily thick. In the first embodiment, the thin film 4 is deposited in the CVD process to have a thickness of 20 nm.

The LDD region 5 is formed by implanting ions of P or As, for example, with $5 \times 10^{13}$ cm$^{-2}$ dose and a 40 KeV acceleration voltage, and by performing the heat treatment process for activation of the implanted impurity and annealing the lattice defect at 800° C. for ten minutes.

The forming steps of the side wall will be described below with reference to FIGS. 3C–3F. The thickness of the side wall is determined in consideration of the performance of the MOS transistor. In the first embodiment, the distance from both edges of the gate electrode where the gate electrode 3 contacts the gate insulating film 2 to the edges of the source and drain regions 8 prior to the heat treatment for impurity activation is set at 100 nm.

The silicon dioxide film is deposited to form the thin film 4 having a thickness of 20 nm in the step shown in FIG. 3B, and the side wall thus necessarily has a thickness of 80 nm. The side wall is formed of a double layer film including the first and second films.

Figure 3C:
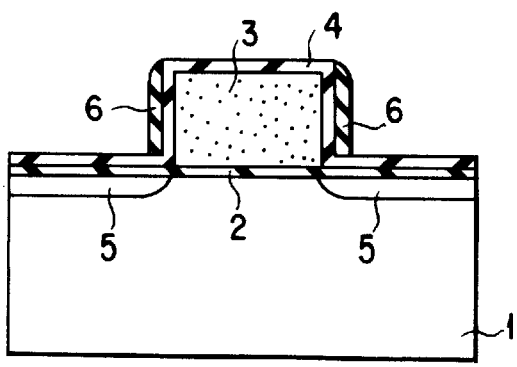

FIG. 3C shows the first side wall 6. The first side wall 6 is preferably formed from the material having a large selective etching ratio relative to the silicon dioxide film 4. When the silicon dioxide film 4 is formed according to the thermal oxidation method, the silicon dioxide film 4 is not formed on the gate dioxide film 2. The first side wall 6 is thus preferably formed from the material having a large selective etching ratio relative to the silicon dioxide films 2 and 4.

In the present embodiment, a silicon nitride film is deposited in the low pressure chemical vapor deposition (hereinafter referred to "LPCVD") process to form the side wall having a thickness of 40 nm. Then, the anisotropic etching is performed to etch the silicon nitride film in the reactive ion etching (hereinafter referred to "RIE") process using $CF_4$-$O_2$ plasma, thereby the first side wall 6 is obtained.

Figure 3D:
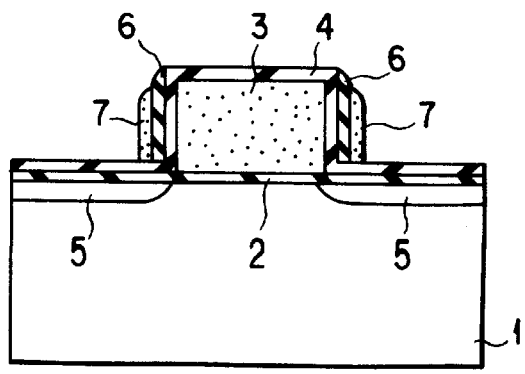

The second side wall 7 shown in FIG. 3D will be described next. At first, a 40 nm thick polysilicon film is deposited in the LPCVD process. Next, the polysilicon film is subjected to the anisotropic etching by the RIE method using $Cl_2$-Ar plasma, to obtain the second side wall 7.

As described above, the gate electrode is provided with side walls including the silicon dioxide film 4, the first side wall 6, and the second side wall 7, and having a thickness of 100 nm as a total thickness of the silicon dioxide film 4, the first side wall 6, and the second side wall 7.

Figure 3E:
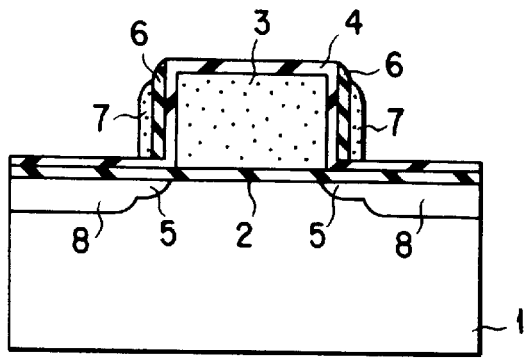
Figure 3F:
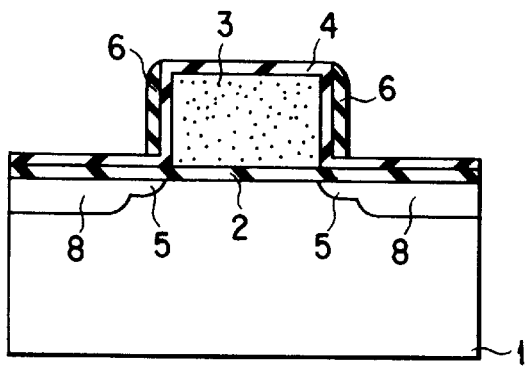

Subsequently, As ions are deeply implanted in dose of $5 \times 10^{15}$ $cm^{-2}$ and with an acceleration voltage of 60 KeV, as shown in FIG. 3E, then the second side wall 7 formed of the polysilicon film is selectively removed by the isotropic etching using $Cl_2$-Ar plasma, as shown in FIG. 3F. Then, the heat treatment process is performed for the impurity activation and the annealing of the lattice defects at 850° C. for ten minutes, to obtain $N^+$ type source and drain regions 8.

As described above, the MOS transistor is formed such that each of the edges of the $N^+$ type source and drain regions 8 implanted with high concentration As ions is apart from the edge of the first side wall formed on the gate electrode by the thickness of the second side wall 7 formed of the polysilicon film. By forming the MOS transistor in this manner, the source and drain regions are both free from the stress applied from the first side wall formed of the silicon nitride film. With this structure, no defect remains in the amorphous layer formed as a result of when the amorphous layer is recrystallized. Subsequent to the above-mentioned steps, a metallization layer is formed in the conventional process, to form the semiconductor manufacturing device.

In the first embodiment described above, the first side wall 6 is formed of a silicon nitride film, and the second side wall 7 is formed of a polysilicon film. The first and second side walls may be formed by replacing the materials of the first and second side walls with each other. In addition, the thin film 4 deposited after forming of the gate electrode 3 may be formed of a silicon nitride film, the first side wall 6 may be formed of a polysilicon film, and the second side wall 7 may be formed of a silicon dioxide film. Similarly, the thin film 4 deposited after forming of the gate electrode 3 may be formed of a silicon nitride film, the first side wall 6 may be formed of a silicon dioxide film, and the second side wall 7 may be formed of a polysilicon film.

Further, the gate electrode 3 formed of a polysilicon film in the above embodiment may be formed of a film made from refractory metal such as tungsten, titanium, or cobalt, i.e., a refractory metal silicide film such as tungsten silicide film, or platinum silicide film.

The gate electrode 3 may be formed of a silicide film formed by heating a stacked film formed by stacking a refractory metal film or platinum film as an upper layer on a polysilicon film as an underlying layer. In this time, a non-reacted refractory metal film or platinum film may be left on the surface of the silicide film in order to improve the conductance of the gate electrode. The gate electrode 3 also may be formed to have a polycide structure wherein a non-reacted polysilicon film is left on the underlying layer.

A simple structure including a polysilicon film and a refractory metal film stacked thereon may be used as the gate electrode. Each of the above-mentioned various structures of the gate electrodes 3 may be provided with a silicon dioxide film or a silicon nitride film stacked thereon.

In the first embodiment of the present invention, a process is described, wherein impurity ions are implanted into the source and drain regions using the first side wall and the second side wall as a mask after forming the first side wall and the second side wall, and the heat treatment process for impurity activation after the second side wall is removed. The same effect can be obtained by performing the ion implantation immediately after the first side wall is formed without forming the second side wall, and then performing the heat treatment for impurity activation after etching back the first side wall. In this time, the etch-back of the first side wall needs not necessarily be performed uniformly on the surface of the first side wall, but the first side wall may be etched back by the local etching performed only in the portion near the substrate.

Figure 4:
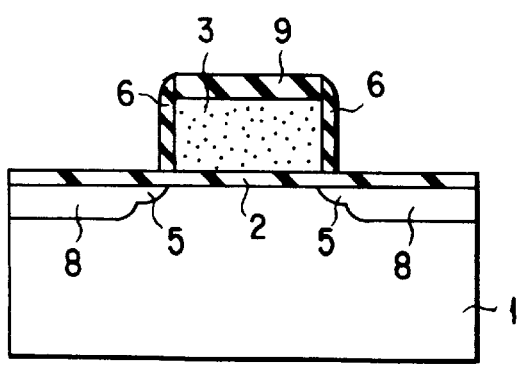
FIG. 4 is a sectional view of a MOS transistor having a side wall gate structure according to the second embodiment of the present invention, wherein a silicon nitride film is formed on a polysilicon gate electrode.

The second embodiment of the present invention will be described below with reference to FIG. 4.

In the second embodiment, the polysilicon film is formed as the gate electrode 3 as shown in FIG. 3A, by stacking a silicon nitride film 9 on the polysilicon film, exposing a gate pattern formed on the silicon nitride film 9 by using a resist, and using the silicon nitride film 9 as an etching mask in an etching process to form the gate electrode 3.

The polysilicon gate electrode 3 formed in this manner to have the silicon nitride film 9 thereon is covered with another silicon nitride film, and subjected to the anisotropic etching by the RIE performed using the silicon nitride film 9 as a mask to form the first side wall formed of the silicon nitride film. The subsequent steps are performed in the same manner as described in the first embodiment to form the MOS transistor as shown in FIGS. 3E and 3F. In these steps, the edge of the side wall is formed on the gate electrode to be separated from the edges of each of the source and drain regions, which are located on the side near to the gate electrode, by the distance equal to the thickness of the second side wall 7 formed of the polysilicon film. By forming the MOS transistor in this manner, the amorphous silicon layer formed in the ion implantation process can be recrystallized without being affected by the stress applied by the first side wall 6 formed of the silicon nitride film. Accordingly, no defect which may cause a leakage current will remain at the edges of the source and drain regions.

The following is the description of the experimental result carried out by the inventors to clarify the relationship between the thickness of the first and second side walls and the defects which may cause a leakage current.

The defects which may cause a leakage current in the source and drain junctions of a MOS transistor is the dislocation generated at the source and drain edges on the surface of the silicon substrate after removing the second side wall 7 formed of a polysilicon film. The density of the dislocation generation determines the amount of the leakage current.

Figure 5A:
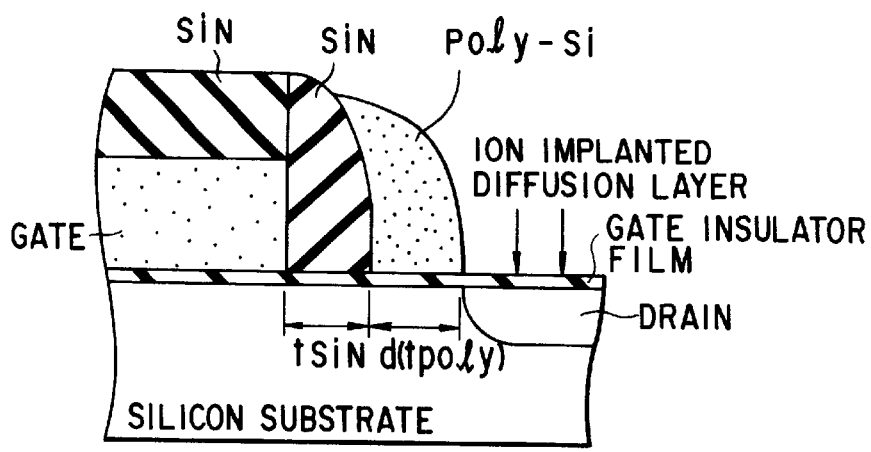
FIG. 5A is an enlarged sectional view of a part of the gate electrode for explaining the relationship between the distance from the edge of the silicon nitride film to the source and drain diffusion regions and the dislocation density.

FIG. 5A shows an enlarged view of the region of a MOS transistor, in which the dislocation is generated. In this experiment, not the process shown in FIGS. 3A–3F but the process of the second embodiment shown in FIG. 4 is employed, wherein a mask is formed of a silicon nitride (SiN) film on the polysilicon gate electrode to perform the pattern formation of the gate electrode. This experiment also differs from the first embodiment in that the thin film 4 covering the polysilicon gate electrode is not provided. These differences, however, do not influence the dislocation generation condition.

Figure 5B:
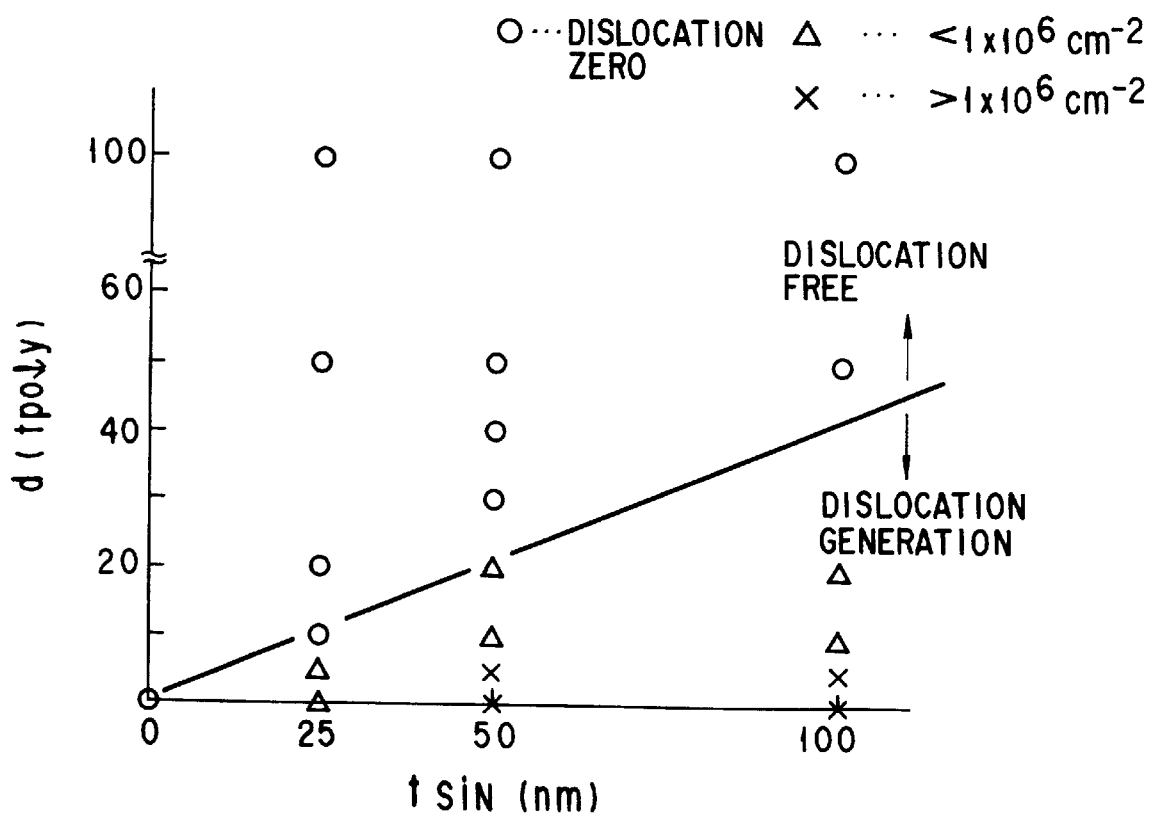
FIG. 5B is a diagram for explaining the relationship between the distance from the edge of the side wall formed of a silicon nitride film to the edges of the source and drain diffusion regions and the dislocation density.

FIG. 5B shows the relationship between t$SiN$, d$_{(tpoly)}$, and the density of the dislocation generation where the thickness of the first side wall is t$_{SiN}$, and the thickness of the second side wall formed of a polysilicon film is d$_{(tpoly)}$.

As is clear from this graph, the smaller the thickness d$_{(tpoly)}$ of the polysilicon film which is removed prior to the heat treatment for activation of the impurity ions implanted into the impurity diffusion layer, the higher the density of the dislocation generated at the edge of the drain region in FIG. 5A due to the stress caused by the strain of the first side wall formed of the silicon nitride film.

This graph further shows that, the larger the thickness t$_{SiN}$ of the first side wall, the larger the strain of the first side wall. It is thus understood that the thickness d$_{(tpoly)}$ necessary for setting the dislocation density at 0 must be large when the thickness t$_{SiN}$ of the first side wall is large.

It was understood from the result of the experiment shown in FIG. 5B that the case of the thickness 40 nm of the first side wall 6 formed of a silicon nitride film and the thickness 40 nm of the second side wall 7 formed of a polysilicon film are included in the scope of dislocation-free at the edges of the source and drain regions.

Figure 6A:
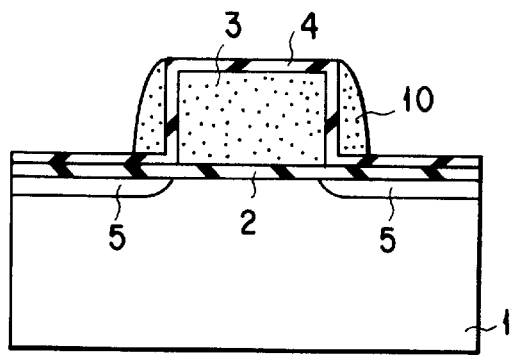
FIGS. 6A–6C are sectional views of a MOS transistor according to the third embodiment of the present invention, which show each step of the manufacturing process of the MOS transistor.

The third embodiment of the present invention will be described below with reference to FIGS. 6A–6C.

This embodiment also employs the same steps as those shown in FIG. 3B and employed in the first embodiment up to the formation of the LDD region 5, and the description thereof will be omitted. In FIG. 6A, 4 denotes a silicon dioxide film having a thickness of 20 nm, which is deposited in the CVD process.

After forming the LDD region 5 in the ion implantation process, a polysilicon film of 80 nm thick is deposited, and then subjected to the anisotropic etching in the RIE process to form side wall 10 formed of the polysilicon film. By adding 80 nm, the thickness of the side wall, 10 to 20 nm, the thickness of the thin film 4 in this manner, an ion implantation mask equal to the side wall having a total thickness of 100 nm can be obtained. The thickness 100 nm is given to the ion implantation mask of this embodiment as one example. The thickness is determined in consideration of the performance required to the MOS transistor.

Figure 6B:
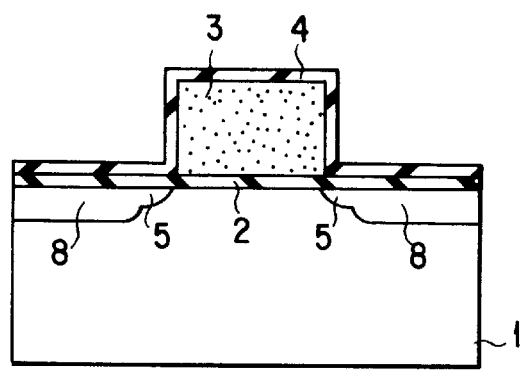
Figure 6C:
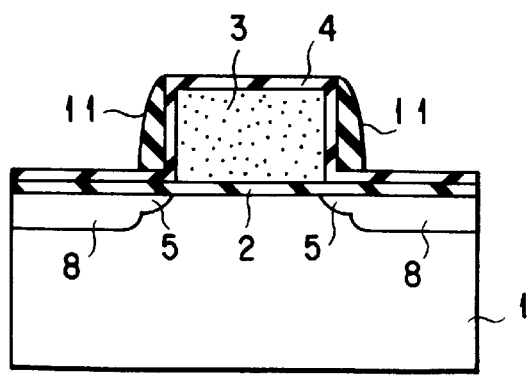

Thereafter, high concentration impurity ions are implanted deeply in the source and drain regions 8, as shown in FIG. 6B, and then the side wall 10 formed of the polysilicon film are removed. The impurity activation and the recrystallization process of the amorphous layer produced by the ion implantation are followed thereto by performing the heat treatment. Since the side wall is removed prior to the heat treatment process, the stress applied to the substrate in the recrystallization is remarkably reduced, with the result that the defects which may cause the leakage current can be suppressed from being formed in the substrate.

In the subsequent steps, the side wall is not always necessary. By performing the mask alignment, ohmic electrodes can be respectively formed in the source and drain regions, and the metallization process will follow thereto.

When the SALICIDE method is employed to perform the metallization process, however, the SALICIDE process must be performed after side wall 11 is formed from an insulating film in order to prevent the short circuit between the silicide film formed on the gate electrode due to the silicide reaction of refractory metal and polysilicon and the silicide film formed on the source and drain regions. The insulating film can be formed from either silicon nitride or silicon dioxide.

In the third embodiment, the side wall is formed of a polysilicon film, but may be also formed of a silicon nitride film or a silicon dioxide film. Further, the gate electrode may be provided with an insulating film deposited thereon, similarly to the second embodiment. In addition, the gate electrode may have the stacked structure wherein the silicide film is stacked on the refractory metal, in the same manner as described at the end the description of the first embodiment.

It is understood that the present invention is not limited to the embodiments described above. All the presented embodiments relate to a N-channel type MOS transistor, but it goes without saying that the structure of the MOS transistor described in the embodiments can be applied to both of N-channel type MOS transistor and P-channel type MOS transistor.

When the semiconductor device is a LSI including of a CMOS comprising a NMOS transistor and a PMOS transistor, for example, the remarkable reduction of the leakage current according to the present invention will greatly contribute to the enhancement of the performance of the semiconductor device and to the improvement of the reliability of the semiconductor device.

The thicknesses of the silicon dioxide film 4, the first side wall 6, and the second side wall 7 are set at the embodiments as 20, 40, and 40 nm, for only one example. It also goes without saying that the optimum film thickness can be selected within the dislocation-free scope shown in FIG. 5B, in which these film and side wall can sufficiently function as side wall for improving the performance and reliability of the MOS transistor.

It is further understood by those skilled in the art that various changes and modifications may be made in the invention without departing from the spirit and scope thereof.

As described above, according to the present invention, no high temperature heat treatment for completely recrystallizing the amorphous layer formed due to the ion implantation needs to be performed, and the defects can be suppressed from being formed at the edges of the source and drain regions near the gate electrode. Therefore the semiconductor device comprising a LDD structure MOS transistor with high performance and reliability and the manufacturing method thereof can be attained.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

What is claimed is:

1. A MOS transistor comprising:

a semiconductor substrate;

a gate insulating film formed on said semiconductor substrate;

a gate electrode formed on said gate insulating film above a first region of said semiconductor substrate;

a first side wall formed on sides of said gate electrode above the first region of said semiconductor substrate;

a thin insulating film held between said first side wall and said gate electrode, said thin insulating film having an etching rate smaller than an etching rate of said first side wall;

highly doped source and drain regions formed in second regions of said semiconductor substrate, the second regions separated from the first region of said semiconductor substrate by third regions of said semiconductor substrate having a predetermined width, wherein edges of said highly doped source and drain regions adjacent to the third regions of said semiconductor substrate are in a dislocation free state.

2. The MOS transistor according to claim 1, wherein said gate electrode is formed of at least one of a polysilicon film, a refractory metal film, a refractory metal silicide film, a platinum silicide film, a stacked film comprising a polysilicon film and a refractory metal film, a stacked film comprising a polysilicon film and a refractory metal silicide film, and a stacked film comprising a polysilicon film and a platinum silicide film.

3. The MOS transistor according to claim 1, further comprising at least one of a silicon oxide film and a silicon nitride film stacked on an upper surface of said gate electrode.

4. The MOS transistor according to claim 1, wherein said first side wall is formed on sides of said gate electrode only above the first region of said semiconductor substrate.

5. The MOS transistor according to claim 1, wherein the predetermined width of said third regions depends on a thickness of a second side wall.

6. The MOS transistor according to claim 5, wherein the thickness of said second side wall depends on a thickness of said first side wall.

* * * * *